United States Patent
Della Fiora et al.

(10) Patent No.: US 7,800,902 B2
(45) Date of Patent: Sep. 21, 2010

(54) AIR BACKFLOW PREVENTION IN AN ENCLOSURE

(75) Inventors: Troy A Della Fiora, Spring, TX (US); John P. Franz, Houston, TX (US); Joseph R. Allen, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 12/133,161

(22) Filed: Jun. 4, 2008

(65) Prior Publication Data

US 2008/0310103 A1 Dec. 18, 2008

Related U.S. Application Data

(60) Provisional application No. 60/941,775, filed on Jun. 4, 2007, provisional application No. 60/943,977, filed on Jun. 14, 2007.

(51) Int. Cl.
*H05K 7/20* (2006.01)

(52) U.S. Cl. .................. 361/695; 361/692; 361/679.48; 361/679.49; 454/184

(58) Field of Classification Search ............ 361/679.46, 361/679.47, 679.49, 679.51, 688, 689, 690–697, 361/717–727; 454/184, 353, 346, 347, 359; 165/122–126, 104.33; 174/16.1, 16.3, 252; 415/177, 178, 213.1, 214.1

See application file for complete search history.

(56) References Cited

U.S. PATENT DOCUMENTS

| | | | |
|---|---|---|---|
| 1,872,599 A * | 8/1932 | Le Grand ........................ 49/95 |
| 5,793,610 A | 8/1998 | Schmitt et al. |
| 5,890,959 A | 4/1999 | Pettit et al. |
| 6,011,689 A | 1/2000 | Wrycraft |
| 6,031,717 A * | 2/2000 | Baddour et al. ........ 361/679.49 |
| 6,042,348 A * | 3/2000 | Aakalu et al. ............ 417/423.5 |
| 6,050,891 A | 4/2000 | Nering |
| 6,115,250 A * | 9/2000 | Schmitt ...................... 361/695 |
| 6,155,920 A * | 12/2000 | Pan et al. .................... 454/184 |
| 6,174,232 B1 | 1/2001 | Stoll et al. |
| 6,181,557 B1 * | 1/2001 | Gatti .......................... 361/695 |
| 6,229,701 B1 * | 5/2001 | Kung et al. ................. 361/688 |
| 6,388,880 B1 | 5/2002 | El-Ghobashy et al. |
| 6,445,581 B1 | 9/2002 | Carbonneau et al. |
| 6,502,628 B1 * | 1/2003 | Siahpolo et al. ............. 165/122 |
| 6,688,965 B1 * | 2/2004 | Crippen et al. ............. 454/184 |
| 6,705,833 B2 * | 3/2004 | Tam et al. ................... 415/146 |
| 6,710,240 B1 * | 3/2004 | Chen et al. ............. 174/17 VA |
| 6,837,785 B2 * | 1/2005 | Soderlund ................... 454/184 |
| 6,991,533 B2 * | 1/2006 | Tsai et al. ................... 454/184 |
| 7,056,204 B2 | 6/2006 | Vinson et al. |
| 7,238,104 B1 * | 7/2007 | Greenslade et al. ......... 454/184 |

(Continued)

FOREIGN PATENT DOCUMENTS

JP 406111559 A * 4/1994

(Continued)

*Primary Examiner*—Michael V Datskovskiy

(57) ABSTRACT

An air backflow prevention member includes a frame assembly including a plurality of vanes and a plurality of stops. The plurality of vanes are rotatable between an open position, wherein the plurality of vanes are oriented oblique to a direction of airflow and in contact with the plurality of stops, and a closed position, wherein the plurality of vanes are oriented perpendicular to the direction of airflow.

10 Claims, 3 Drawing Sheets

U.S. PATENT DOCUMENTS

| | | | |
|---|---|---|---|
| 7,306,426 B2 * | 12/2007 | Franz et al. | 415/123 |
| 7,326,032 B2 | 2/2008 | Vinson et al. | |
| 7,345,875 B2 * | 3/2008 | Elkins | 361/695 |
| 7,416,481 B2 * | 8/2008 | Baker et al. | 454/184 |
| 7,535,709 B2 * | 5/2009 | Fan et al. | 361/695 |
| 7,558,061 B2 * | 7/2009 | Franz et al. | 361/695 |
| 2005/0088818 A1 | 4/2005 | Chou | |
| 2006/0016482 A1 | 1/2006 | Berens et al. | |
| 2006/0152900 A1 | 7/2006 | Nishi et al. | |

FOREIGN PATENT DOCUMENTS

| | | |
|---|---|---|
| JP | 2002176281 A * | 6/2002 |

\* cited by examiner

AIR BACKFLOW PREVENTION IN AN ENCLOSURE

CROSS-REFERENCE TO RELATED APPLICATIONS

This Utility patent application is based on and claims the benefit of U.S. Provisional Application No. 60/941,775, filed on Jun. 4, 2007, and U.S. Provisional Application No. 60/943,977, filed Jun. 14, 2007, the contents of which are both hereby incorporated by reference in their entirety.

BACKGROUND

Computer system enclosures may include cooling systems to regulate the temperature of their electrical components. One type of cooling system is a forced air system that relies on a plurality of air movers to blow air over the electrical components in order to cool the components. When an air mover fails, the path through the air mover can become a free path for air movement in any direction depending on the pressurization of the system. Since multiple air movers tend to be grouped in close proximity, and/or to be located on the same side of the enclosure to better facilitate airflow through the enclosure, a free path for air through the enclosure exhausts air near the intake of other air movers. This situation results in recirculation of air and a loss of cooling efficiency. Further, large unexpected gaps in the enclosure can cause pressure drops for which remaining air movers may be unable to compensate.

DETAILED DESCRIPTION

In the following detailed description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
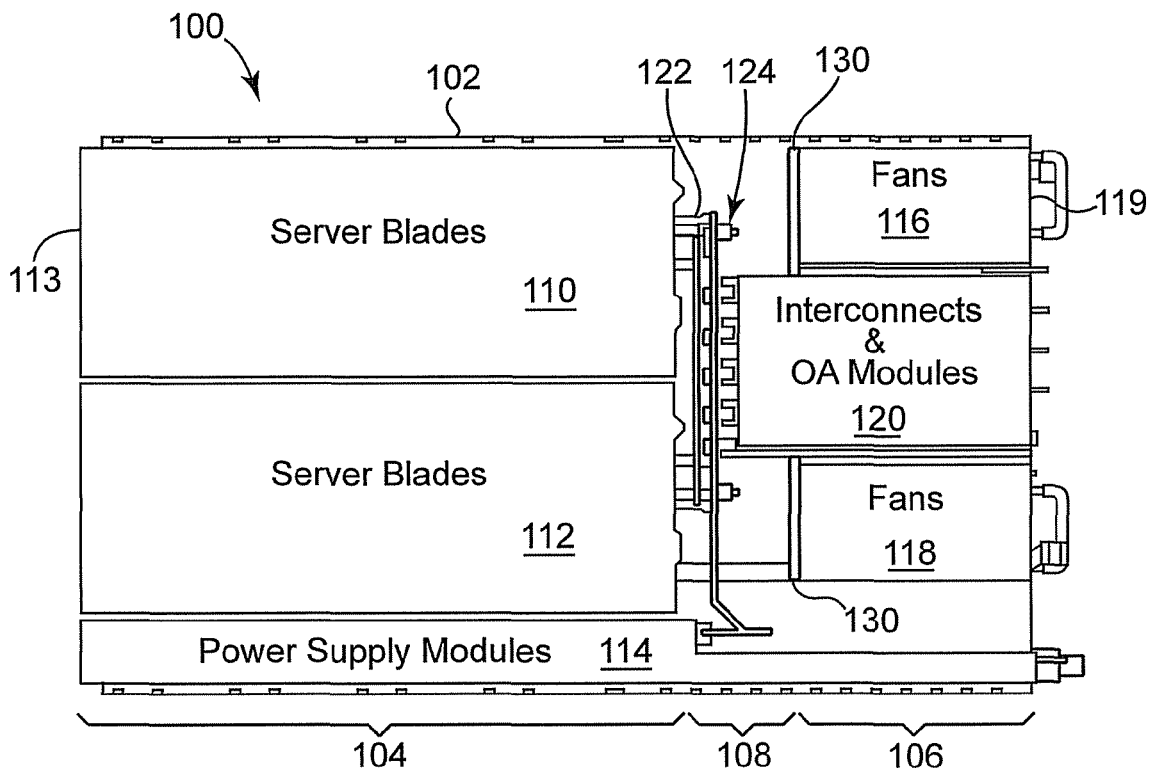
FIG. 1 is a schematic view of one embodiment of a computer enclosure.

FIG. 1 is a schematic view of one embodiment of a computer enclosure 100. Enclosure 100 includes a chassis 102 that is arranged in a front region 104, a back region 106 and a central plenum 108 positioned between the front region 104 and the back region 106. Chassis 102 includes a plurality of sections for housing components therein. It is worth noting that any number of electronic modules, air movers and other components, as described below, can be positioned within chassis 102 as desired.

In the illustrated embodiment, front region 104 includes a plurality of upper bays 110 and lower bays 112 for housing electronic modules (e.g., server blades, storage blades, optical drives) and at least one airflow inlet, for example schematically shown as inlet 113, to allow air to flow into a front of the chassis 102. In one embodiment, front region 104 also houses one or more power supply modules in section 114. In one embodiment, back region 106 is adapted to house a plurality of air movers in sections 116 and 118 as well as other modules (e.g., power supplies, keyboard video mouse modules, interconnect modules) in section 120.

In the embodiment illustrated, a signal midplane module 122 is provided to transmit signals between servers in bays 110 and 112 to modules in section 120. Additionally, a backplane power module 124 is provided to distribute power from the power supply modules in section 114 to electrical components stored within chassis 102.

In one embodiment, the air movers in sections 116 and 118 seal into central plenum 108 and operate to bring air into chassis 102 through front region 104 and out at least one airflow outlet, for example schematically shown as outlet 119, in a rear of the chassis 102. The air movers operation thus creates a negative pressure region within central plenum 108.

In one embodiment, back region 106 includes a plurality of air backflow prevention members 130 fluidly coupled to the plurality of air movers in front of sections 116 and 118. The air backflow prevention members 130 allow air to pass in only a single direction (i.e., from front region 104 of chassis 102 to back region 106 of chassis 102).

In the illustrated embodiment, the air backflow prevention members 130 allow air to flow from the central plenum 108 to the back region 106, but prevent air from flowing from back region 106 to central plenum 108. Additionally, if an air mover fluidly coupled to one of the air backflow prevention members 130 fails to operate or is removed from chassis 102, the air backflow prevention member 130 will close due to negative pressure in central plenum 108. Thus, air flow will be directed to air movers (e.g., operational fans) within sections 116 and/or 118.

In some situations, it can be desirable for the air backflow prevention members 130 to have a small thickness to preserve space within chassis 102. In one embodiment, a thickness of the air backflow prevention members 130 is less than 2 inches. In another embodiment, the thickness is less than 1 inch and in yet another embodiment, the thickness is less than ½ inch. It will be appreciated that there exists a tradeoff between a number of elements used to block airflow in an air backflow prevention member and the thickness of the air backflow prevention member.

Figure 2:
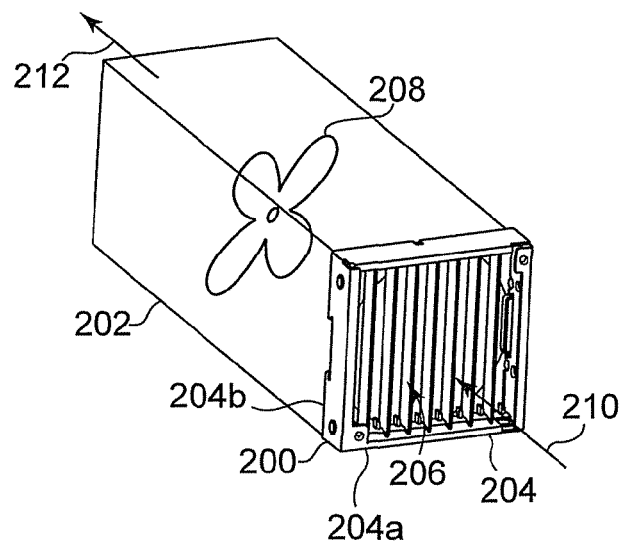
FIG. 2 is a perspective view of one embodiment of an air backflow prevention member coupled to an air mover.

FIG. 2 is a close-up view of one embodiment of an air backflow prevention member 200 and an air mover 202. Air mover 202 seals into central plenum 108 through air backflow prevention member 200. In one embodiment, air backflow prevention member 200 includes a frame assembly 204 that encloses a plurality of vanes 206 that can adjust between an open position (allowing airflow therethrough) and a closed position (blocking airflow therethrough). The frame assembly 204 includes a front edge 204a forming an air inlet and a rear edge 204b forming an air outlet. In one embodiment, a thickness of frame assembly 204 from the front edge to the rear edge is greater than a thickness of the plurality of vanes 206.

In one embodiment, air mover 202 includes a fan 208 that, when operating, draws air through backflow prevention member 200 through the plurality of vanes 206 in a direction denoted by arrow 210. Air is then exhausted by air mover 202 in a direction denoted by arrow 212.

During operation, air flow created by fan 208 causes the plurality of vanes 206 to rotate to an open position and be maintained in an open position. In the open position, the plurality of vanes 206 rotate about an axis to an angle less than perpendicular to the front edge of frame assembly 204 and oblique to arrow 210. In one embodiment, the plurality of vanes 206 contact a plurality of stops positioned near the rear edge of the frame assembly. If fan 208 is not operating or air mover 202 is removed, each of the plurality of vanes 206 return to a closed position due to the pressure differential between central plenum 108 and corresponding section (e.g. one of sections 116 and 118), wherein each of the plurality of vanes 206 close against each other and are substantially perpendicular to arrow 210.

Figure 3:
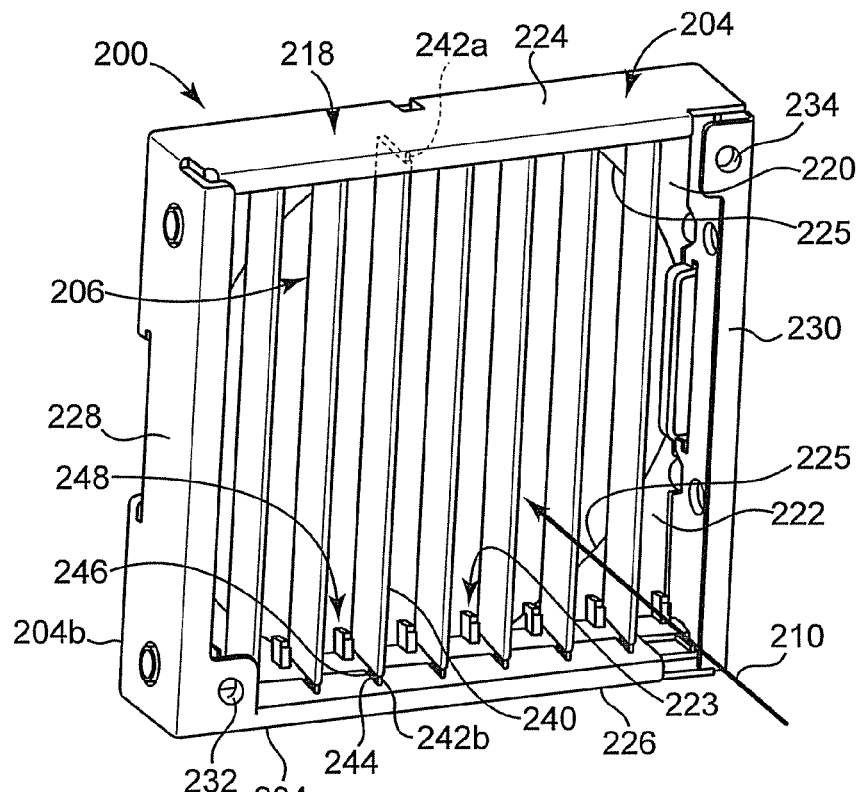
FIG. 3 is an isometric view of one embodiment of an air backflow prevention member in an open position.
Figure 4:
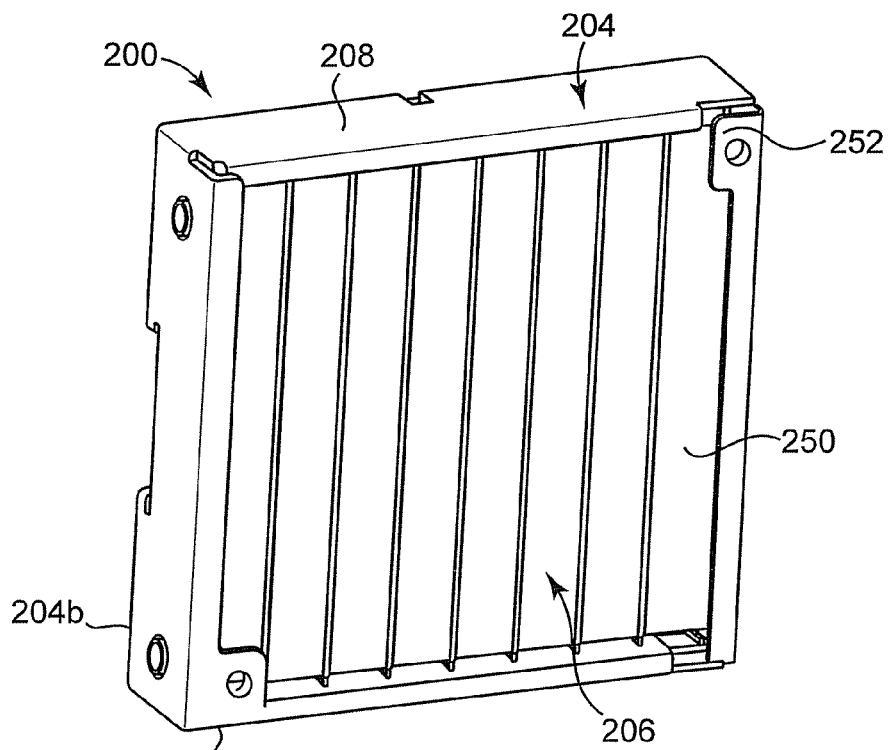
FIG. 4 is an isometric view of the air backflow prevention member of FIG. 3 in a closed position.
Figure 5:
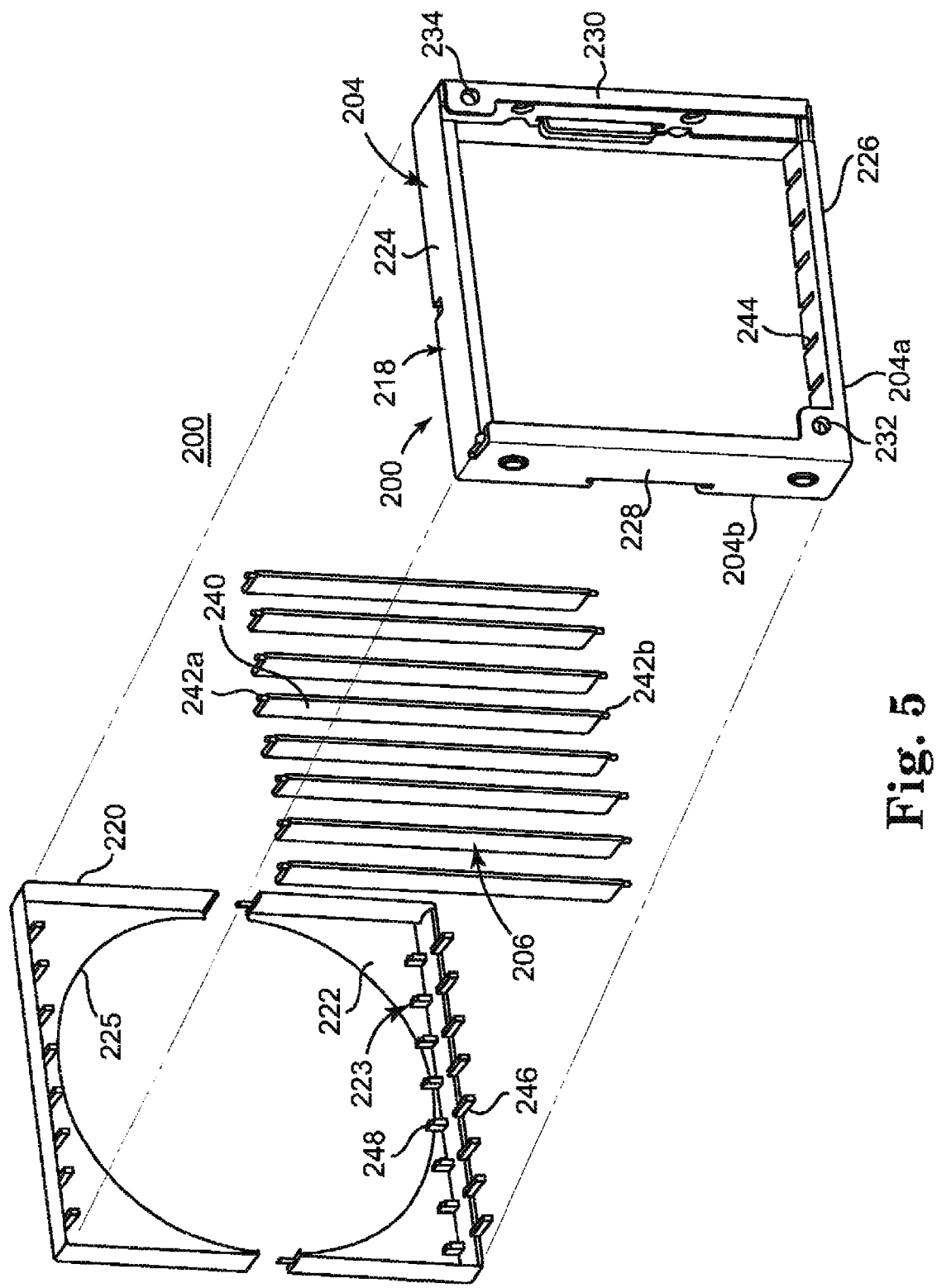
FIG. 5 is an exploded view of the air backflow prevention member of FIG. 3.

FIGS. 3 and 4 illustrate air backflow prevention member 200 in an open position and a closed position, respectively. FIG. 5 illustrates an exploded view of air backflow prevention member 200. In one embodiment, when fan 208 of air mover 202 is operational, air backflow prevention member 200 will be in the open position, as illustrated in FIG. 3. In one embodiment, when fan 208 is not operational or if air mover 202 has been removed from chassis 102, backflow prevention member 200 will be in the closed position as illustrated in FIG. 4.

In one embodiment as illustrated in FIG. 3, frame assembly 204 is formed of a mounting portion or element 218 and a locking element formed of two vane locking portions 220 and 222. Mounting element 218 includes top and bottom sides 224 and 226, which receive the plurality of vanes 206. Additionally, mounting element 218 includes left and right sides 228 and 230 having apertures 232 and 234, respectively, which receive fasteners for mounting backflow prevention member 200 to chassis 102 or air mover 202.

In one embodiment, the plurality of vanes 206 are positioned within the mounting element 218 such that once the plurality of vanes 206 are positioned within the mounting element 218, locking portions 220 and 222 can be positioned to secure the plurality of vanes 206 to the mounting element 218. In one embodiment, mounting element 218 is formed of metal and locking portions 220 and 222 are formed of plastic, which can snap into place to secure the plurality of vanes 206 to the mounting element 218. In one embodiment, the locking element can be formed of a single unit rather than two separate locking portions 220 and 222.

In one embodiment, locking portions 220 and 222 each include a plurality of stops 223 that prevent the plurality of vanes 206 from rotating to an angle that is parallel to a direction of airflow 210 flowing through backflow prevention member 200. Additionally, locking portions 220 and 222 include flanges 225 at the rear edge 204b of frame assembly 204 that form a circular opening. The circular opening can be coupled to a corresponding projection on air mover 202 to create a seal between backflow prevention member 200 and air mover 202.

In one embodiment, each of the plurality of vanes 206 are similarly constructed and are secured to frame assembly 204 in a similar manner. With particular reference to vane 240, pins 242a and 242b are located at an upper portion and a lower portion of vane 240 to cooperate with top and bottom sides 224 and 226, respectively. For example, lower pin 242b of vane 240 slides into a corresponding slot 244 of bottom side 226 and upper pin 242a of vane 240 slides into a corresponding slot (not shown) of top side 224. Locking portion 222 includes a projection 246 that cooperates with slot 244 to hold vane 240 in place. In one embodiment, locking portion 220 also includes a corresponding projection to cooperate with the slot of top side 224 to hold the upper pin 242a of vane 240 in place.

In one embodiment, a stop 248 is provided on locking portion 222 to prevent vane 240 from opening to a direction parallel to airflow 210. In one example, stop 248 is positioned to prevent vane 240 from rotating past an angle less than 90 degrees from a front edge 204a of frame assembly 204. In another example, stop 248 is positioned to stop vane 240 from rotating past an angle of approximately 85-89 degrees. In yet another example, stop 248 is positioned to prevent vane 240 from rotating past an angle of approximately 87 degrees. A stop is also provided in locking portion 220 at an angle similar to stop 248 to prevent vane 240 from rotating past a desire angle.

In addition to vane 240, the other vanes 206 of air backflow prevention member 200 are secured to frame assembly 204 in a similar manner to vane 240 and have corresponding stops to prevent the vanes from rotating past a desired angle with respect to a front edge of frame assembly 204. In particular, top and bottom sides 224 and 226 of frame assembly 204 include a plurality of slots to receive upper and lower (i.e., top and bottom) pins of the plurality of vanes 206. In addition, locking portions 220 and 222 include a plurality of projections that cooperate with the slots to secure the plurality of vanes 206 to frame assembly 204. The locking portions 220 and 222 also include a plurality of stops to prevent the plurality of vanes 206 from rotating past a desired angle.

In the embodiment of FIG. 4, the plurality of vanes 206 are in the closed position, oriented parallel to front edge 204a. As a result, air flow through the air backflow prevention member 200 is blocked. Vane 250, one of the plurality of vanes 206 and positioned proximate side 230 of mounting element 218, is positioned to contact a flange 252 in the closed position to be parallel to front edge 204a. The other vanes can overlap or otherwise be positioned to prevent air flow through air backflow prevention member 200 when in the closed position.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An enclosure for regulating temperature of electronic modules positioned within the enclosure, comprising:
a chassis having at least one airflow inlet and at least one airflow outlet;
an air mover positioned within the chassis and creating airflow from said at least one airflow inlet to said at least one airflow outlet during operation of the air mover; and
an air backflow prevention member positioned within the chassis between the airflow inlet and the air mover, fluidly coupled to the air mover and positioned to receive airflow from the at least one airflow inlet, the backflow prevention member including a frame assembly having a plurality of vanes and a plurality of stops for the plurality of vanes, the plurality of vanes rotatable between an open position during operation of the air mover due to the airflow created by the air mover, wherein the plurality of vanes are oriented oblique to a direction of airflow and in contact with the plurality of stops, and a closed position, wherein the plurality of vanes are oriented perpendicular to the direction when the air mover is not in operation due to pressure in the chassis.

2. The enclosure of claim 1 wherein the frame assembly includes a mounting element and a locking element adapted to secure the plurality of vanes to the mounting element.

3. The enclosure of claim 1 wherein a thickness of the frame assembly is greater than a thickness of the plurality of vanes.

4. The enclosure of claim 3 wherein the thickness of the frame assembly is less than 1 inch.

5. A method for regulating temperature within an enclosure, comprising:
- providing a chassis having an airflow inlet and an airflow outlet;
- positioning an electronic module within the chassis proximate the airflow inlet;
- positioning an air mover in the chassis proximate the airflow outlet;
- positioning an air backflow prevention member within the chassis between the electronic module and the air mover, the backflow prevention member fluidly coupled to the air mover and positioned to receive airflow from the airflow inlet, the backflow prevention member including a frame assembly having a plurality of vanes and a plurality of stops for the plurality of vanes, the plurality of vanes rotatable between an open position, wherein the plurality of vanes are oriented oblique to a direction of airflow and in contact with the plurality of stops, and a closed position, wherein the plurality of vanes are oriented perpendicular to the direction of airflow operating the air mover such that the plurality of vanes move to the open position; and
- moving the plurality of vanes to the closed position when not operating the air mover due to pressure in the chassis.

6. The method of claim 5 wherein the frame assembly includes a mounting element and a locking element including the plurality of stops, the locking element adapted to secure the plurality of vanes to the mounting element.

7. The method of claim 6 wherein the mounting element includes a plurality of slots adapted to receive pins extending from each of the plurality of vanes.

8. The method of claim 7 wherein the locking element includes a plurality of projections cooperating with the plurality of slots to secure the pins extending from each of the plurality of vanes to the mounting element.

9. The method of claim 6 wherein the locking element forms a circular opening.

10. The method of claim 5 wherein a thickness of the frame assembly is greater than a thickness of the plurality of vanes.

* * * * *